United States Patent [19]

Okajima

[11] Patent Number: 5,287,313
[45] Date of Patent: Feb. 15, 1994

[54] METHOD OF TESTING DATA-HOLDING CAPABILITY OF A SEMICONDUCTOR MEMORY DEVICE

[75] Inventor: Susumu Okajima, Kyoto, Japan

[73] Assignee: Rohm Co., Ltd., Kyoto, Japan

[21] Appl. No.: 903,739

[22] Filed: Jun. 24, 1992

[30] Foreign Application Priority Data

Aug. 7, 1991 [JP] Japan .................. 3-223424

[51] Int. Cl.$^5$ ............ H01L 21/66; H01L 29/78
[52] U.S. Cl. .................. 365/201; 156/643; 156/345
[58] Field of Search ............. 365/201; 156/643, 345

[56] References Cited

FOREIGN PATENT DOCUMENTS 1-82539 3/1989 Japan .

Primary Examiner—Eugene R. LaRoche
Assistant Examiner—Viet Q. Nguyen
Attorney, Agent, or Firm—Brumbaugh, Graves, Donohue & Raymond

[57] ABSTRACT

Test data is written into respective semiconductor memory devices, e.g., EEPROMs formed on a wafer. Then, the semiconductor memory devices, still located on the wafer, are baked in a high-temperature atmosphere for a predetermined time. Examples of the baking temperature and time are 200° C. and 8 hours. The test data is read from the respective semiconductor devices to check whether the test data is held by the respective memory devices in a correct manner.

3 Claims, 1 Drawing Sheet

METHOD OF TESTING DATA-HOLDING CAPABILITY OF A SEMICONDUCTOR MEMORY DEVICE

BACKGROUND OF THE INVENTION

The present invention relates to a method of testing semiconductor memory devices such as., an EEPROM (electrically erasable programmable ROM) and an EPROM (erasable programmable ROM). More specifically, the invention relates to an accelerated testing method of the data-holding capability of semiconductor memory devices.

In general, it is assured that semiconductor memory devices such as an EEPROM have a capability of holding written data for at least a specified time. For example, a data-holding time of 10 years in an atmosphere of 70° C. is assured. However, since it is not practical to perform, in a semiconductor manufacturing process, a test of placing a semiconductor memory device in a 70° C. atmosphere for 10 years to confirm a satisfactory data-holding ability, an accelerated data-holding test is conventionally performed in which a semiconductor memory device is subjected to a baking treatment.

Referring to FIG. 2, an example of a procedure of the accelerated test is described below.

First, in a semiconductor substrate (hereinafter referred to simply as "wafer") measurement step N1, electrical characteristics of memory devices, which have been formed on the wafer in a wafer production process, are measured. In an assembling step N2, the wafer is cut into pieces of individual memory devices, which are then subjected to die bonding and wire boding and finally sealed using a resin or the like. In measurement step 1 (step N3), electrical characteristics of the packaged semiconductor memory device are evaluated. In this measurement step 1, data for an accelerated data-holding test (hereinafter referred to simply as "test data") are written into the semiconductor memory device.

In a baking step N4, the semiconductor memory device, in which the test data have been written, is subjected to a baking treatment for the accelerated test. In the baking treatment, for example, the semiconductor memory device is placed in an atmosphere of 150° C. for 143 hours. After the baking treatment, it is checked in measurement step 2 (step N5) whether the test data are held in the semiconductor memory device in a correct manner. Then, the semiconductor devices which have passed the tests are shipped.

However, the above-described conventional testing method has the following problems:

1) Because of the limitations of, for instance, heat resistance of the resin to be used for sealing the semiconductor memory device the temperature of the baking treatment atmosphere is restricted to a relatively low value. Therefore, although the term "accelerated test" is used, a relatively long period is required for the baking treatment, which causes a low operational efficiency.

2) In order to baking a large number of packaged semiconductor memory devices at one time, a large-scale heat treatment apparatus and a wide space for accommodating it are required.

3) When the packaged semiconductor memory device is placed in a high-temperature atmosphere for a long time, the thermal expansion etc. of the sealing resin will impose an undesired stress on the internal device and ultra-thin wires (e.g., gold wires), which may cause a reduction of a reliability of the semiconductor memory device. Further, oxidized lead terminals will become difficult to be soldered.

SUMMARY OF THE INVENTION

The present invention has been made in consideration of the above problems in the art and, therefore, an object of the invention is to provide an accelerated testing method of the data-holding capability of a semiconductor memory device which can be performed easily in a short period, and which never reduces a reliability of the semiconductor memory device.

According to the invention, a method of testing a data-holding capability of a semiconductor memory device comprises the steps of:

writing test data into respective semiconductor memory devices formed on a semiconductor substrate;

baking the semiconductor substrate in a high-temperature atmosphere for a predetermined period;

reading the test data from the respective semiconductor memory devices; and checking whether the test data is held by the respective semiconductor memory devices in a correct manner.

DESCRIPTION OF THE PREFERRED EMBODIMENT

Figure 1:
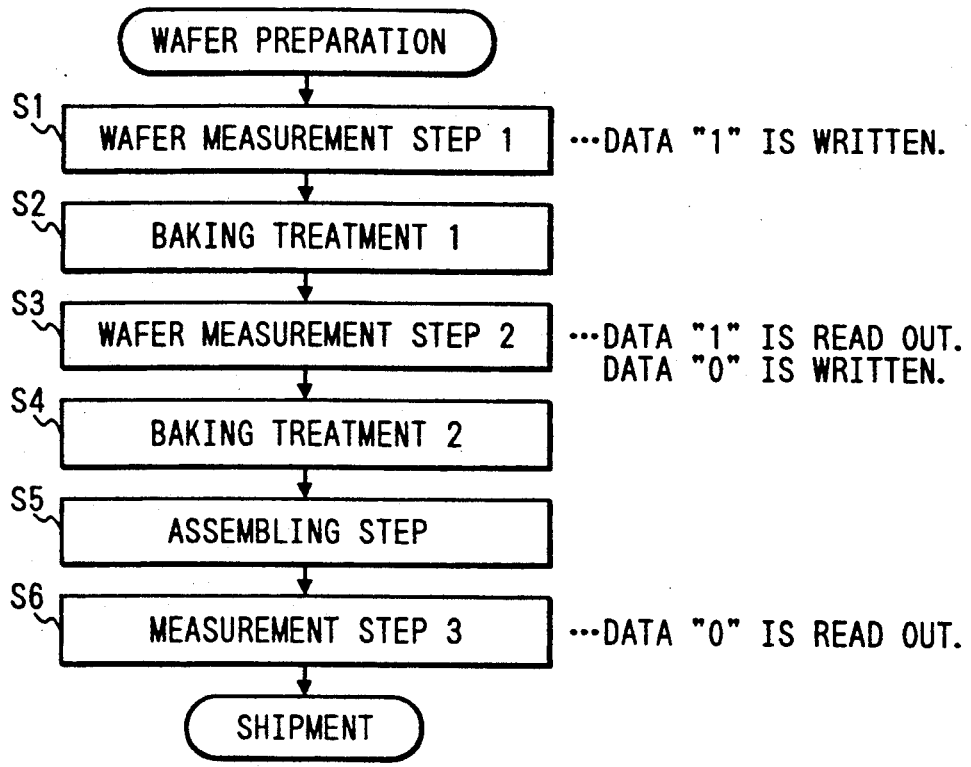
FIG. 1 is a flowchart showing a procedure of a method of testing the data-holding capability of a semiconductor memory device according to an embodiment of the present invention.
Figure 2:
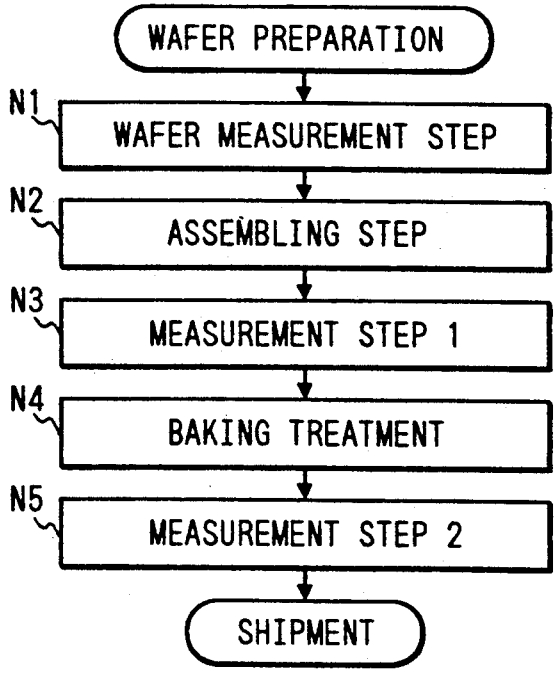
FIG. 2 is a flowchart showing a procedure of a conventional method of testing the data-holding capability of a semiconductor memory device.

An embodiment of the present invention is described hereinafter with reference to the drawing. FIG. 1 is a flowchart showing a procedure of a semiconductor memory device testing method according to the embodiment.

A water, on which semiconductor devices, for instance, EEPROMs are formed in a wafer production process, is provided to wafer measurement step 1 (step S1). In the wafer measurement step 1, various electrical characteristics of the EEPROMs are tested, and then test data "1" is written into all the memory cells of each EEPROM.

The wafer having the EEPROMs, in which the test data "1" has been written, is subjected to baking treatment 1 (step S2). The baking treatment 1 is performed in an atmosphere of a higher temperature for a shorter time than the conventional method in which the packaged semiconductor memory device is baked. For example, the baking temperature and time are 200° C. and 8 hours, respectively.

After subjected to the baking treatment 1, the wafer is provided to wafer measurement step 2 (step S3). In the wafer measurement step 2, the test data "1," which has been written in the wafer measurement step 1, is read out to check whether all the data are held in a correct manner. If all the data are held correctly, another test data "0" is written into all the memory cells of each EEPROM.

The wafer having the EEPROMs, in which the test data "0" has been written, is subjected to baking treatment 2 (step S4) having the same baking conditions as the baking treatment 1.

After subjected to the baking treatment 2, in an assembling step (step S5), the wafer is cut into pieces of individual devices. Then, die bonding, wire bonding, resin sealing, etc. are performed, and each EEPROM is packaged.

The packaged EEPROM is provided to measurement step 3 (step S6). In the measurement step 3, the test data "0," which has been written in the wafer measurement step 2, is read out to check whether all the data are held in a correct manner. Further, the other electrical characteristics are tested. The EEPROMs which have passed all the above tests are shipped.

In the above embodiment, since each of the baking treatments 1 and 2 is performed in a short period, the data-holding capability is checked for both test data "0" and "1" while the baking treatment is performed twice, to improve the reliability of the test. However, the invention is not limited to this case, but the baking treatment for the accelerated test may be performed just once.

In the above embodiment, no wafer measurement is performed immediately after the baking treatment 2. Instead, the data "0" is read out to check the data-holding capability in the measurement step 3 after the assembling (packaging) step. This is also intended to improve the reliability of the test, because the EEPROMs are exposed to a high-temperature atmosphere in the die bonding etc. of the assembling step and, as a result, the data-holding capability is tested with the EEPROMs that have undergone the processes of severer conditions. However, the invention is not limited to this case, but the test data "0" may be read from the EEPROMs on the wafer immediately after the baking treatment 2 and only the ordinary characteristics can be tested in the measurement step 3 after the assembling step.

Although the EEPROM is taken as an example in the above embodiment, the invention can be applied to other semiconductor memory devices such as an EPROM and a microprocessor in which an EEPROM, EPROM, etc. are incorporated.

As is apparent from the above description, according to the semiconductor memory device testing method of the invention, the semiconductor memory devices, still located on a single wafer, are subjected to the baking treatment for the accelerated test. Therefore, compared with the conventional testing method in which the assembled and packaged semiconductor memory device is subjected to the baking treatment, the baking treatment of the invention can be performed in a higher-temperature atmosphere, which results in a shorter baking time and an improved efficiency. Further, a reduction of the reliability that is associated with the conventional method can be avoided in the invention.

Since a plurality of wafers each having a large number of semiconductor memory devices can be baked at one time, a heat treatment apparatus for the baking treatment can be a smaller one, which is an advantage in space utilization.

What is claimed is:

1. A method of testing a data-holding capability of a semiconductor memory device, comprising the steps of:
    writing first test data into respective semiconductor memory devices formed on a semiconductor substrate;
    baking the semiconductor substrate in a high-temperature atmosphere for a predetermined period;
    reading the first test data from the respective semiconductor memory devices; and
    checking based on the readout test data whether the first test data is held by the respective semiconductor memory devices in a correct manner.

2. The method of claim 1, further comprising the steps of:
    writing second test data into the respective semiconductor memory devices formed on said semiconductor substrate;
    baking the semiconductor substrate in a high-temperature atmosphere for a predetermined period;
    reading the second test data from the respective semiconductor memory devices; and
    checking based on the readout second test data whether the second test data is held by the respective semiconductor memory devices in a correct manner.

3. The method of claim 1, further comprising the steps of:
    writing second test data into the respective semiconductor memory devices formed on said semiconductor substrate;
    baking the semiconductor substrate in a high-temperature atmosphere for a predetermined period;
    separating the respective semiconductor memory devices from the semiconductor substrate and producing packaged semiconductor memory devices;
    reading the second test data from the respective packaged semiconductor memory devices; and
    checking based on the readout second test data whether the second test data is held by the respective packaged semiconductor memory devices in a correct manner.

* * * * *